(12) United States Patent
Van Zijl et al.

(10) Patent No.: US 11,249,161 B2
(45) Date of Patent: Feb. 15, 2022

(54) MAGNETIC RESONANCE METHOD FOR DETECTING MOLECULAR BINDING WITH ENHANCED SENSITIVITY

(71) Applicants: The Johns Hopkins University, Baltimore, MD (US); Kennedy Krieger Institute, Baltimore, MD (US)

(72) Inventors: Peter Van Zijl, Hanover, MD (US); Nirbhay Yadav, Baltimore, MD (US)

(73) Assignees: The Johns Hopkins University, Baltimore, MD (US); Kennedy Krieger Institute, Baltimore, MD (US)

( * ) Notice: Subject to any disclaimer, the term of this patent is extended or adjusted under 35 U.S.C. 154(b) by 350 days.

(21) Appl. No.: 16/490,219

(22) PCT Filed: Mar. 2, 2018

(86) PCT No.: PCT/US2018/020779
§ 371 (c)(1),
(2) Date: Aug. 30, 2019

(87) PCT Pub. No.: WO2018/161046
PCT Pub. Date: Sep. 7, 2018

(65) Prior Publication Data
US 2020/0072932 A1    Mar. 5, 2020

Related U.S. Application Data

(60) Provisional application No. 62/466,881, filed on Mar. 3, 2017.

(51) Int. Cl.
*G01R 33/56* (2006.01)
*G01R 33/46* (2006.01)
*G01R 33/465* (2006.01)

(52) U.S. Cl.
CPC ....... *G01R 33/5605* (2013.01); *G01R 33/465* (2013.01); *G01R 33/4608* (2013.01); *G01R 33/4616* (2013.01); *G01R 33/5608* (2013.01)

(58) Field of Classification Search
USPC ........................................... 346/173
See application file for complete search history.

(56) References Cited

U.S. PATENT DOCUMENTS 8,568,690 B2    10/2013 Lu et al.
2005/0112716 A1 *  5/2005 Sem .................. C12Q 1/32
                                                   506/6

(Continued)

FOREIGN PATENT DOCUMENTS

WO    2007-022543 A2    2/2007
WO    2007-062063 A2    5/2007

OTHER PUBLICATIONS

International Search Report and Written Opinion in corresponding International Application No. PCT/US2018/020779 dated Jun. 1, 2018.

*Primary Examiner* — Rodney E Fuller
(74) *Attorney, Agent, or Firm* — Venable LLP; Henry J. Daley; Aziz H. Poonawalla

(57) ABSTRACT

A method to detect transient binding of a substrate molecule of interest in solution to a molecular target includes selecting the substrate molecule of interest and the molecular target such that the substrate molecule of interest can transiently bind to the molecular target; placing one of a sample or a subject of interest in a magnetic resonance (MR) apparatus, the sample or the subject of interest containing the substrate molecule of interest so as to be in contact with the molecular target; providing magnetic labelling of non-exchangeable or slowly exchangeable MR sensitive nuclei of the substrate molecule of interest; receiving an MR signal from the MR sensitive nuclei of the solvent molecules using the MR (Continued)

apparatus; and analyzing the MR signal to obtain a quantity associated with the transient binding of the substrate molecule of interest to the molecular target.

37 Claims, 9 Drawing Sheets

(56) References Cited

U.S. PATENT DOCUMENTS

| | | |
|---|---|---|
| 2009/0029392 A1 | 1/2009 | Josephson et al. |
| 2010/0330570 A1 | 12/2010 | Vander Horn et al. |
| 2019/0219646 A1* | 7/2019 | Dmochowski ......... G16H 30/20 |

* cited by examiner

MAGNETIC RESONANCE METHOD FOR DETECTING MOLECULAR BINDING WITH ENHANCED SENSITIVITY

CROSS-REFERENCE OF RELATED APPLICATION

This application is a National Stage Application under 35 U.S.C. § 371 of International Application No. PCT/US2018/020779 filed Mar. 2, 2018, which claims priority to U.S. Provisional Application No. 62/466,881 filed Mar. 3, 2017, the entire contents of which are hereby incorporated by reference.

FEDERAL FUNDING

This invention was made with Government support of Grant No. RO1 EB015032 awarded by The National Institutes of Health (NIH). The Government has certain rights in the invention.

BACKGROUND

1. Technical Field

The field of the currently claimed embodiments of this invention relates to magnetic resonance methods for detecting molecular binding with enhanced sensitivity.

2. Discussion of Related Art

The ability to noninvasively measure drug-target interactions for the evaluation of biological activity and treatment efficacy in individual patients is expected to be a crucial feature of personalized medicine. Currently, the most sensitive modality for imaging substrate-target interactions in patients is nuclear medicine, using tracer concentrations of radiolabeled probes that have sufficient affinity and selectively for a target of interest. Unfortunately, most hospitals do not have such equipment. Magnetic resonance imaging (MRI) is a commonly available technology, but, due to its poor detection sensitivity for low-concentration molecules, limited MRI (water-detection) methods are available to study the effects of substrate binding. One approach available for human studies is so-called physiological MRI, where the effect of neuro-receptor stimuli is measured indirectly via their hemodynamic consequences[1], i.e. without molecular specificity. Other approaches have remained limited to animal studies, for instance use of receptor substrates labeled with metallic compounds that increase water relaxation[2,3]. To our best knowledge, there currently are no molecular MRI approaches that can study the target binding of non-chemically labeled substrates.

Magnetic resonance spectroscopy (MRS) is a powerful tool for studying molecular structure and function. In vitro MRS methods are important for small molecule screening and lead optimization in drug discovery. Advantages include applicability to a broad range of proteins and drugs, no requirement for isotopic labelling, and the possibility of directly identifying the binding component from a mixture of ligands[4,5]. The sensitivity of MRS to different binding mechanisms has allowed the in vitro study of ligand binding to receptors via changes in rotational or translational motion[6] and of receptor recognition via magnetic coupling between ligand and receptor molecules[7]. Of these, magnetization transfer (MT)[8] is the most commonly used for drug discovery and screening in vitro[5,9] and even to study molecular reaction specifics in vivo[10-12]. MT methods rely on selective radiofrequency (RF) irradiation of a nuclear spin pool (generally protons) on one molecule and measuring the transfer of this irradiation to another[13]. Magnetic labeling for the purpose of magnetic resonance is defined as a process in which the equilibrium magnetic state of a pool of nuclei with a magnetic moment is disturbed. One way to do this is by applying RF irradiation to reduce the magnetization of a proton pool (a process called saturation), another is to excite it. A different way of labeling is to change the equilibrium magnetic state chemically, by hyperpolarizing the pool of nuclei, leading to a much larger equilibrium longitudinal magnetization. An example where RF labeling is used is in saturation transfer difference (STD) experiments[7], protons on a protein or other macromolecule with a long rotational correlation time ($\tau_c$) are selectively saturated using low power RF pulses. Efficient dipolar transfer (spin diffusion) ensures the immediate spread of this label throughout the macromolecule and transfer to bound ligand. Chemical exchange between bound and free ligand results in specific MRS detection of the label in free ligand. For a large excess of ligand (approx. 100-1000:1) and sufficiently fast dissociation rates ($K_d$~mM-µM range), appreciable increases in sensitivity can be obtained since irradiated bound ligands are continuously being replaced by unlabeled free ligands, resulting in a cumulative buildup of labeled molecules in the solvent. This allows low concentrations (nM-pM) of receptors to be used[5]. While well suited for in vitro spectroscopy, the STD sensitivity enhancement is still not sufficient for in vivo imaging, because ligands would at most be in the millimolar range to ascertain biocompatibility and avoid toxicity.

Therefore, there remains a need for improved methods for detecting molecular binding with enhanced sensitivity and preferably using MRI with water detection to allow application in most clinics worldwide.

SUMMARY

According to some embodiments of the invention, a method to detect transient binding of a substrate molecule of interest in solution to a molecular target includes selecting the substrate molecule of interest and the molecular target such that the substrate molecule of interest can transiently bind to the molecular target; placing one of a sample or a subject of interest in a magnetic resonance (MR) apparatus, the sample or the subject of interest containing the substrate molecule of interest so as to be in contact with the molecular target; providing magnetic labeling of non-exchangeable or slowly exchangeable MR sensitive nuclei of the substrate molecule of interest, wherein the selecting the substrate molecule of interest and the molecular target comprises selecting the substrate molecule of interest and the molecular target such that transient binding transfers magnetic labeling from the MR sensitive nuclei of the substrate molecule to MR sensitive nuclei of the molecular target, wherein the magnetic labeling becomes distributed over MR sensitive nuclei of the molecular target, and wherein the MR sensitive nuclei of the molecular target transfer the magnetic labeling to MR sensitive nuclei of solvent molecules of the solution. The method further includes receiving an MR signal from the MR sensitive nuclei of the solvent molecules using the MR apparatus; and analyzing the MR signal to obtain a quantity associated with the transient binding of the substrate molecule of interest to the molecular target.

BRIEF DESCRIPTION OF THE DRAWINGS

Further objectives and advantages will become apparent from a consideration of the description, drawings, and examples.

DETAILED DESCRIPTION

Figure 1:
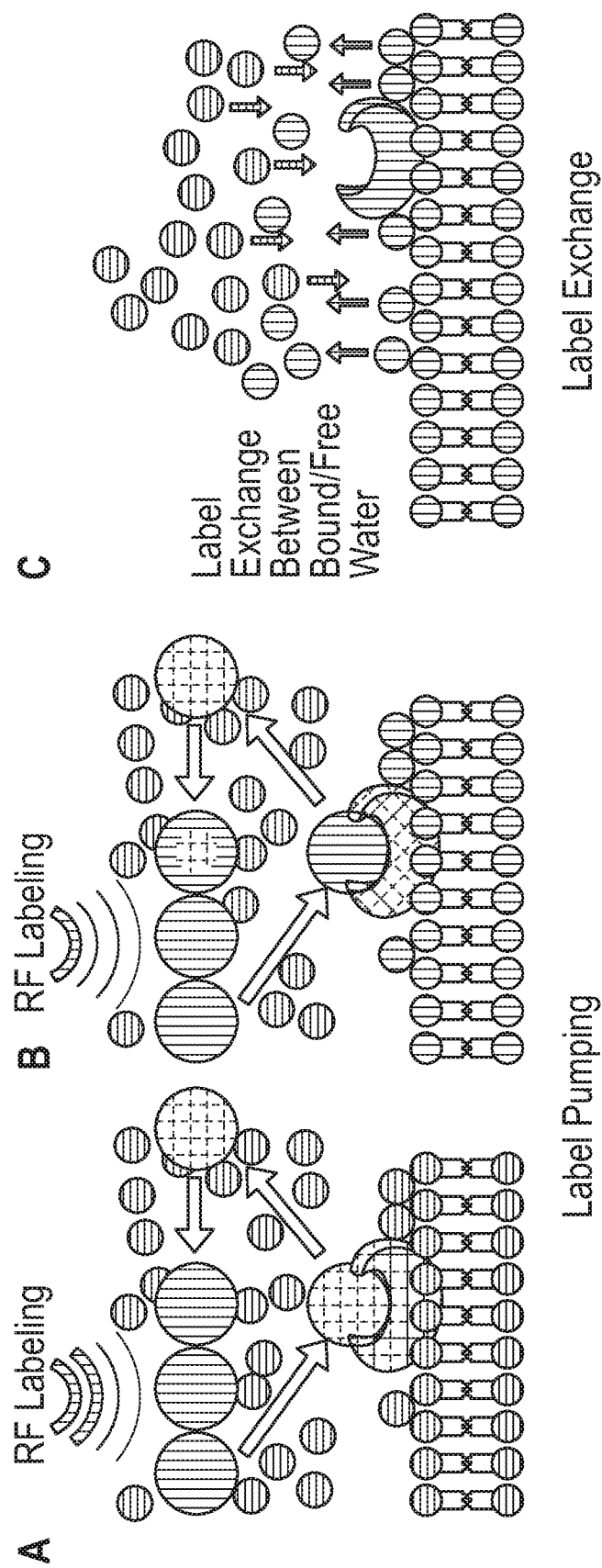
FIG. 1 shows concepts of the IMMOBILISE (IMaging of MOlecular BInding using Ligand Immobilization and Saturation Exchange) method according to some embodiments. (A) Non-exchanging protons (CH, CH2 or CH3) in a low molecular weight molecule (large ball) that exchanges rapidly between free in solution and bound to an immobile target, are labelled in the free state using RF irradiation (indicated in red). (B) During binding, the label is rapidly transferred to target protons, after which the substrate is released. Due to continuous irradiation of substrate protons and availability of a large substrate pool, the released molecule is replaced by labeled substrate and the process repeats itself. Spin diffusion rapidly distributes the label over the target protons. (C) Ultimately, this label is transferred to the water, either via exchangeable protons or through dipolar coupling to protons in bound water molecules, where it appears as signal loss (saturation). Since the water pool is large, the saturated protons or water molecules are replaced by nonsaturated ones and the principle repeats itself. In this figure just one type of magnetic labeling is used. Others are described in the text above and below.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Magnetic Resonance Imaging (MRI) is rarely used for molecular binding studies and never without synthetic metallic labels. Some embodiments of the current invention provide an MRI approach that can specifically detect the binding of natural substrates (i.e. no chemical labels). To accomplish such detection of substrate-target interaction only, according to some embodiments of the current invention, we exploit (i) the narrow resonance of aliphatic protons in free substrate for selective radio-frequency (RF) labeling and, (ii) the process of immobilization upon binding to a solid-like target for fast magnetic transfer of this label over protons in the target backbone. This cascade of events is ultimately detected with MRI using magnetic interaction between target and water protons. We prove this principle using caffeine as a substrate in vitro and then apply it in vivo in the mouse brain in some examples. The combined effects of continuous labeling (label pumping), dynamic reversible binding, and water detection were found to enhance the detection sensitivity by about two to three orders of magnitude in an embodiment of the current invention.

According to some embodiments of the invention, a method to detect transient binding of a substrate molecule of interest in solution to a molecular target includes selecting the substrate molecule of interest and the molecular target such that the substrate molecule of interest can transiently bind to the molecular target; placing one of a sample or a subject of interest in a magnetic resonance (MR) apparatus, the sample or the subject of interest containing the substrate molecule of interest so as to be in contact with the molecular target; providing magnetic labeling of non-exchangeable or slowly exchangeable MR sensitive nuclei of the substrate molecule of interest, wherein the selecting the substrate molecule of interest and the molecular target comprises selecting the substrate molecule of interest and the molecular target such that transient binding transfers magnetic labeling from the MR sensitive nuclei of the substrate molecule to MR sensitive nuclei of the molecular target, wherein the magnetic labeling becomes distributed over MR sensitive nuclei of the molecular target, and wherein the MR sensitive nuclei of the molecular target transfer the magnetic labeling to MR sensitive nuclei of solvent molecules of the solution. The method further includes receiving an MR signal from the MR sensitive nuclei of the solvent molecules using the MR apparatus; and analyzing the MR signal to obtain a quantity associated with the transient binding of the substrate molecule of interest to the molecular target.

According to some embodiments, the method further includes administering the substrate molecule of interest so as to be in contact with the molecular target. According to some embodiments, the magnetic labeling of non-exchangeable or slowly exchangeable MR sensitive nuclei of the substrate molecule of interest is done using a radio frequency (RF) pulse sequence from the MR apparatus. According to some embodiments, the magnetic labeling of non-exchangeable or slowly exchangeable MR sensitive nuclei of the administered substrate molecule of interest is done before administration using a chemical magnetic labeling procedure. According to some embodiments, the chemical magnetic labeling procedure is done using isotopic substitution with nuclei with a magnetic moment including hyperpolarization of such nuclei.

According to some embodiments, the magnetic labeling is provided substantially continuously over a selected period of time before signal reception so as to maintain label on a substrate molecular pool containing the substrate molecule of interest. According to some embodiments, providing magnetic labeling of slowly exchangeable MR sensitive nuclei of the substrate molecule of interest comprises providing magnetic labeling of MR sensitive nuclei that exchange at a rate slower than an inverse of a longitudinal relaxation time of the MR sensitive nuclei.

According to some embodiments, the substrate molecule of interest and the molecular target are selected such that transient binding is done repetitively with substrate containing magnetically labelled nuclei replacing substrate from which label was transferred to the molecular target in order to enhance the amount of magnetic labeling transferred from the substrate molecular pool to the molecular target and distributed over the molecular target and transferred from the molecular target to the solvent.

According to some embodiments, the method comprises at least one of magnetic resonance imaging (MRI), magnetic resonance spectroscopy (MRS), magnetic resonance spectroscopic imaging (MRSI), or high resolution nuclear magnetic resonance (NMR) spectroscopy.

According to some embodiments, the administrating is intravenous, oral or any medically approved administration. According to some embodiments, the detecting transient binding has an increased MR detection sensitivity of at least a factor of two larger than an MR signal expected based on a concentration of the molecular substrate in solution. According to some embodiments, transient binding comprises a life time of the bound complex of the substrate molecule of interest and the molecular target of less than 1 second.

According to some embodiments, the substrate molecule of interest comprises an organic, inorganic or bio-organic chemical compound containing non-exchangeable or slowly-exchangeable MR sensitive nuclei. According to some embodiments, the molecular target is a molecular target of low mobility so as to comprise molecules that are either partially or fully immobilized or move sufficiently slowly in solution to allow sufficiently fast transfer of magnetization between the molecular target's MR sensitive nuclei to allow the transfer within a time corresponding to less than 5 times T1 of the molecular target's protons. According to some embodiments, the substrate molecule is one of a drug, a metabolite, an amino acid, a small protein, a peptide, a nucleic acid, a small DNA, an RNA, or a sugar molecule.

According to some embodiments, the substrate molecule is either endogenous to tissue of the sample or the subject of interest or added exogenously thereto or to any configuration holding a molecular target of low mobility. According to some embodiments, a configuration holding a molecular target of low mobility comprises a living subject (human or animal), a separation column, a binding essay with cells, or a chemical or biochemical mixture. According to some embodiments, the molecular target is a protein, DNA, carbohydrate, glycoprotein, receptor, cell membrane, column material, or any solid or semi-solid chemical or biochemical material.

According to some embodiments, the MR sensitive nuclei are isotopes that have a nuclear magnetic moment. The isotopes include but are not limited to 1H, 13C, 15N, 14N, 17O, 31P, 23Na, 19F, 2H, 39K, and 29Si, for example. According to some embodiments, providing magnetic labeling using RF pulses comprises applying sufficient RF strength at a frequency of the nuclei and varying a number of RF pulses or an RF pulse duration, amplitude, or inter-pulse delay to adjust a magnitude and phase of the magnetization of the pool of nuclei. According to some embodiments, a number of RF pulses of the RF pulse sequence is at least one.

According to some embodiments, transient binding comprises a time sufficiently long to transfer the magnetic label from the substrate to the target but sufficiently short to, during a period of at most five times the longitudinal relaxation time T1 of the molecular protons, allow multiple binding events to occur and allow label to be transferred via the MR sensitive nuclei of the target to the MR sensitive nuclei of the solvent.

According to some embodiments, the transfer of the magnetic labeling to the MR sensitive nuclei of the molecular target during the transient binding comprises through-space dipolar transfer. According to some embodiments, distribution of the magnetic labeling over the MR sensitive nuclei of the molecular target is accomplished using through-space dipolar transfer. According to some embodiments, transfer of the magnetic labeling from MR sensitive nuclei of the molecular target to the MR sensitive nuclei of the solvent occurs through processes of dipolar transfer or chemical exchange.

According to some embodiments, the solvent is tissue water used in MRI. According to some embodiments, the solvent is any chemical used for dissolving molecular substrates used in chemical binding processes.

According to some embodiments, an MR signal relates to a signal recorded using any MR method currently known or possible. According to some embodiments, the MR signal is recorded as a function of time before, during and after administration of substrate molecule of interest to the sample or subject in the MR apparatus. According to some embodiments, analyzing the recorded MR signal relates to on-line or off-line processing of such data related to the amount of transferred signal consequential to the binding.

According to some embodiments, the quantity associated with the binding of the molecule is one of a signal intensity or signal intensity change showing the presence of binding, or a binding rate/dissociation constant associated with the substrate molecule. According to some embodiments, the signal intensity or signal intensity change or binding rate/dissociation constant is used for determining a distribution of endogenous receptor molecules. According to some embodiments, the signal intensity or signal intensity change or binding rate/dissociation constant is analyzed in at least one tissue area. According to some embodiments, the method further includes ascertaining whether the signal intensity, signal intensity change, or binding rate/dissociation constant is abnormal.

According to some embodiments, tissues having the molecular target include healthy tissue, cancerous tissues whether malignant or benign, tissue that has experienced trauma, tissue that has experienced ischemia or infarct, tissue that has experienced insult, or bodily fluids.

According to some embodiments, the method further includes the steps of: acquiring MR image data of a spatial region of interest; assessing a magnitude of or a change in molecular content, molecular target, affinity between a binding pair, or pH of tissue in the region of interest using a RF label and magnetization transfer technique; and adjusting contrast of the acquired MR image data based on the assessing so the adjusted acquired MR image data reflects relative differences of the one of molecular content, receptor density, or binding affinity between spatial areas, tissues, and the like within the spatial region of interest. According to some embodiments, the method further includes generating images based on the adjusted acquired MR image data.

Some embodiments of the current invention provide magnetic resonance detection with enhanced sensitivity of substrate molecules (e.g., drugs, metabolites) undergoing reversible binding to a molecular target. Detection is done indirectly through a solvent signal (e.g., water or any other solvent) that can be used for Magnetic Resonance methods (MRI, NMR, etc.) for chemical processes in industry or laboratories.

Some aspects of the current invention can include, but are not limited to, the following:
- Endogenous and exogenous substrates can be imaged;
- High translatability as many embodiments without need for chemical modification of substrate are possible;
- Embodiments with chemical modification are also possible;
- Method can image low-affinity binding;
- Noninvasive magnetic labeling using radiofrequency pulses;
- Label enhanced using molecular pump principle;
- Applications possible in industry, basic lab research and clinic;
- Contrary to the existing chemical exchange saturation transfer (CEST) MRI method, which uses proton exchange to enhance sensitivity, the approach disclosed herein uses molecular exchange and magnetic labeling of nuclei (including protons) that do not exchange or exchange slowly as defined in the embodiments.

All of the MR approaches discussed in the Background to detect binding are based on detection of mM signal levels using spectroscopy and, as such, are not practical for fast use in the clinic. Early MT studies[14-18] have shown the existence of a coupling between small metabolites and water that is mediated through nearby semi-solid components. Here we exploit this coupling to design a molecular pump based sensitivity enhancement method that allows the water-based imaging of dynamic binding of actual biological substrates (no chemical modifications) to a macro-molecular target. The principle of the approach, outlined in FIG. 1, is based on the continuous pumping of a magnetic label from substrate to the water detected in MRI that is accomplished through reversible substrate binding to a rigid target molecule (FIG. 1, (A), (B)). After efficient transfer through the target, this label ultimately shows up as signal loss (saturation) on the water signal (FIG. 1, (C)). Based on this mechanism, we call this the "IMMOBILISE" approach, for "IMaging of MOlecular BInding using Ligand Immobilization and Saturation Exchange". We show that we can achieve specificity not only to the substrate of interest but also to the binding process, while retaining the capability to detect the signal with MRI. This method enhances the detection sensitivity with one to two orders of magnitude beyond current in vitro binding methods (e.g., saturation transfer difference (STD)[7]).

In addition to non-invasively labeling the nuclei in substrate molecules using one or more RF pulses, it is also possible to label these nuclei by increasing their magnetic polarization through a hyperpolarization procedure. This needs to be done outside the MR scanner and thus is possible only for substrates that will be administered. In this case, without a need for radiofrequency excitation of the hyperpolarized nuclei, the hyperpolarization can be transferred via dipolar interaction to the nuclei in the target molecule of low mobility and subsequently to the water protons through dipolar interaction. When following this with simple water imaging, a hyperintensity should occur for the region or tissue only when binding occurs. This includes transfer of hyperpolarization from heteronuclei to protons, without need for a special coil at the frequency for the heteronuclei, because the detection is done through water protons. Imaging signal will be seen only when those substrate molecules bind to the target. A good name for this approach would be: "IMMOBILIZME" approach, for "IMaging of MOlecular BInding using Ligand Immobilization and Z-Magnetization Exchange".

The following examples and further description help explain some concepts of the current invention. The broad concepts of this invention are not limited to the particular examples.

EXAMPLES

Results and Discussion

Figure 4:
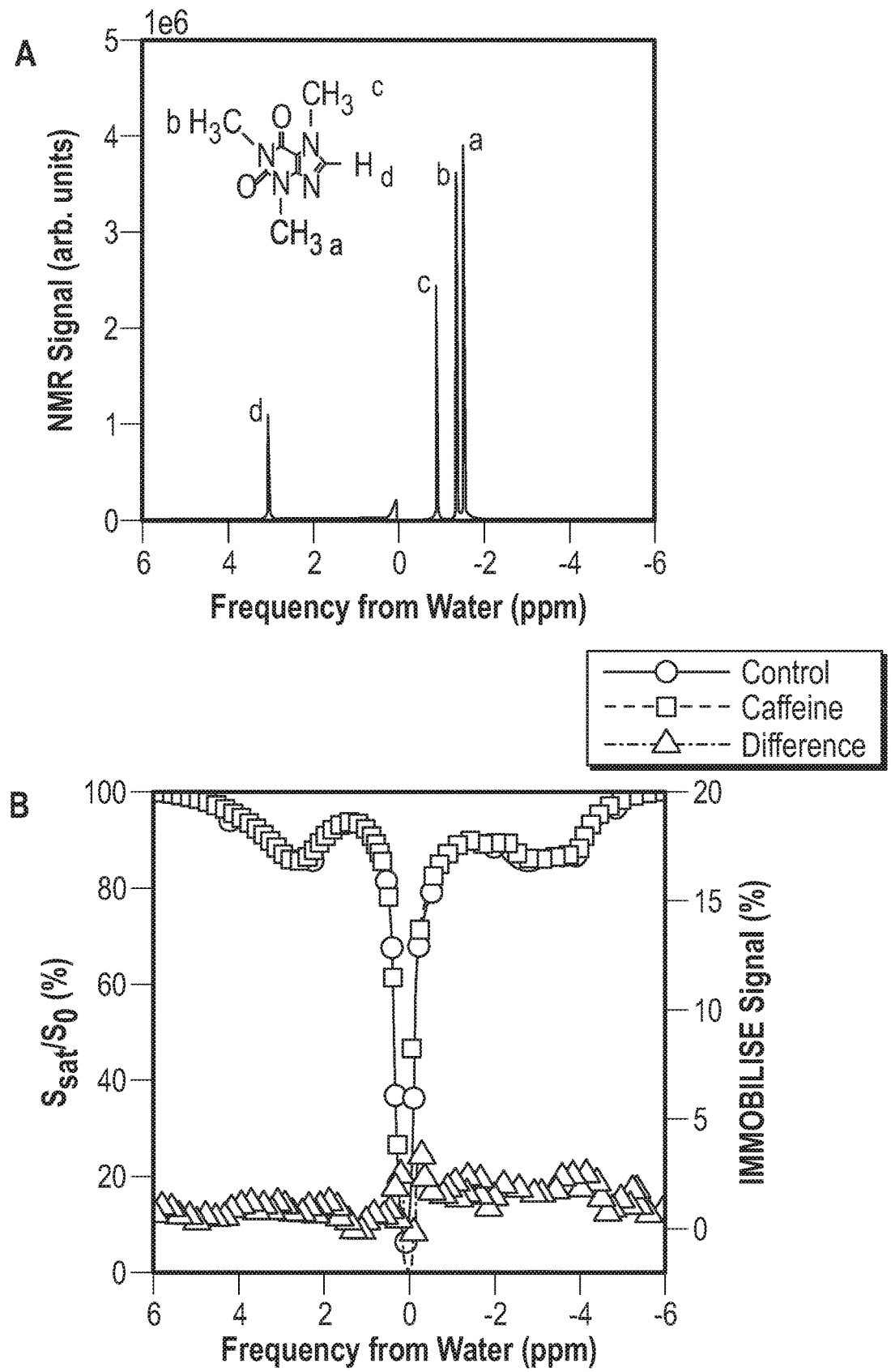
FIG. 4 shows an in vitro demonstration of the IMMOBILISE approach. (A) NMR spectrum of 100 mM caffeine solution. (B,C) Z-spectra of BSA solution (20% w/w) without ($\Delta$) and with ($\times$) 100 mM caffeine for free (B) and cross-linked (C) BSA. The difference spectrum ("IMMOBILISE" signal) is shown in circles. The frequency in (A)-(C) is referenced to the water resonance (4.7 ppm in nuclear magnetic resonance (NMR) spectroscopy).
Figure 4:
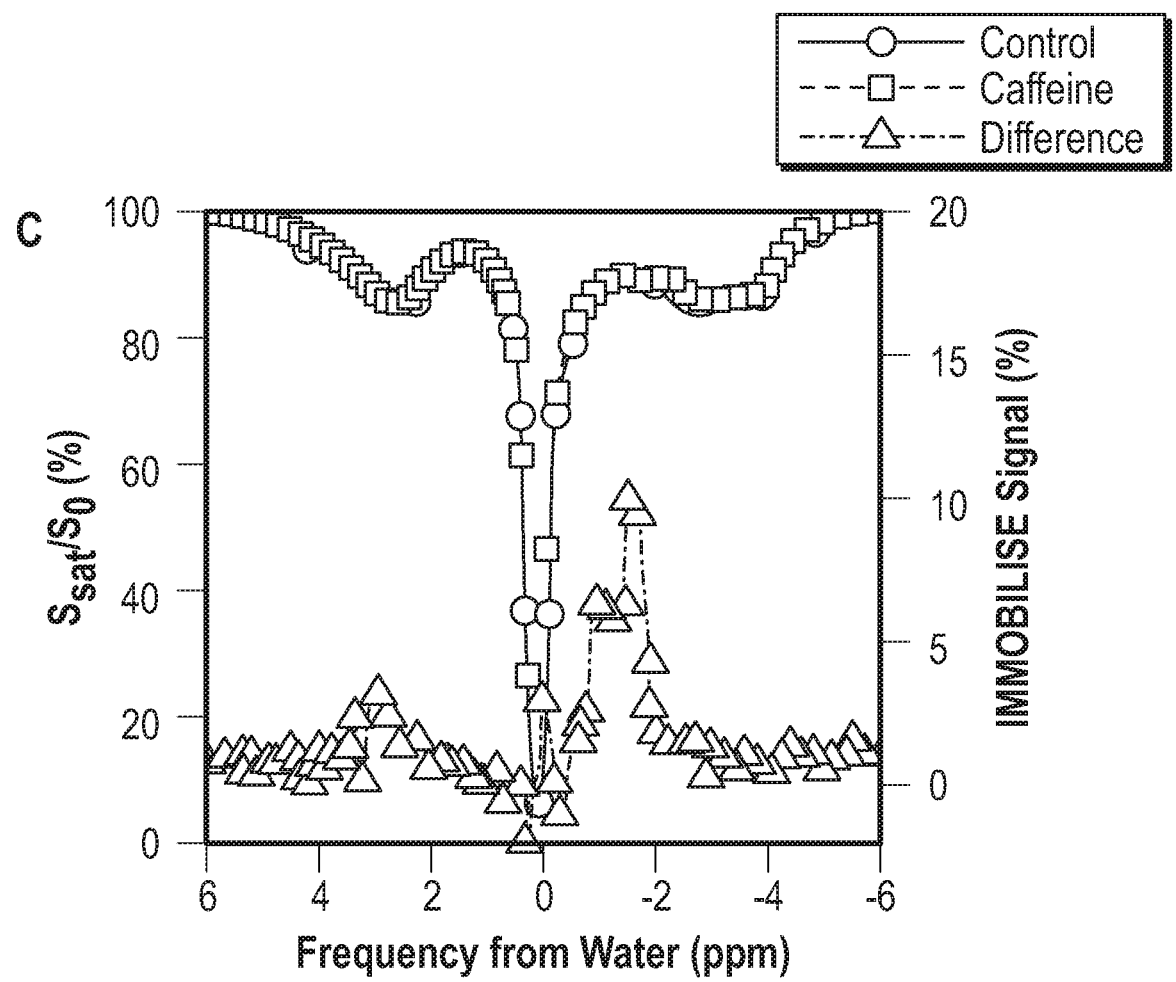
Figure 5:
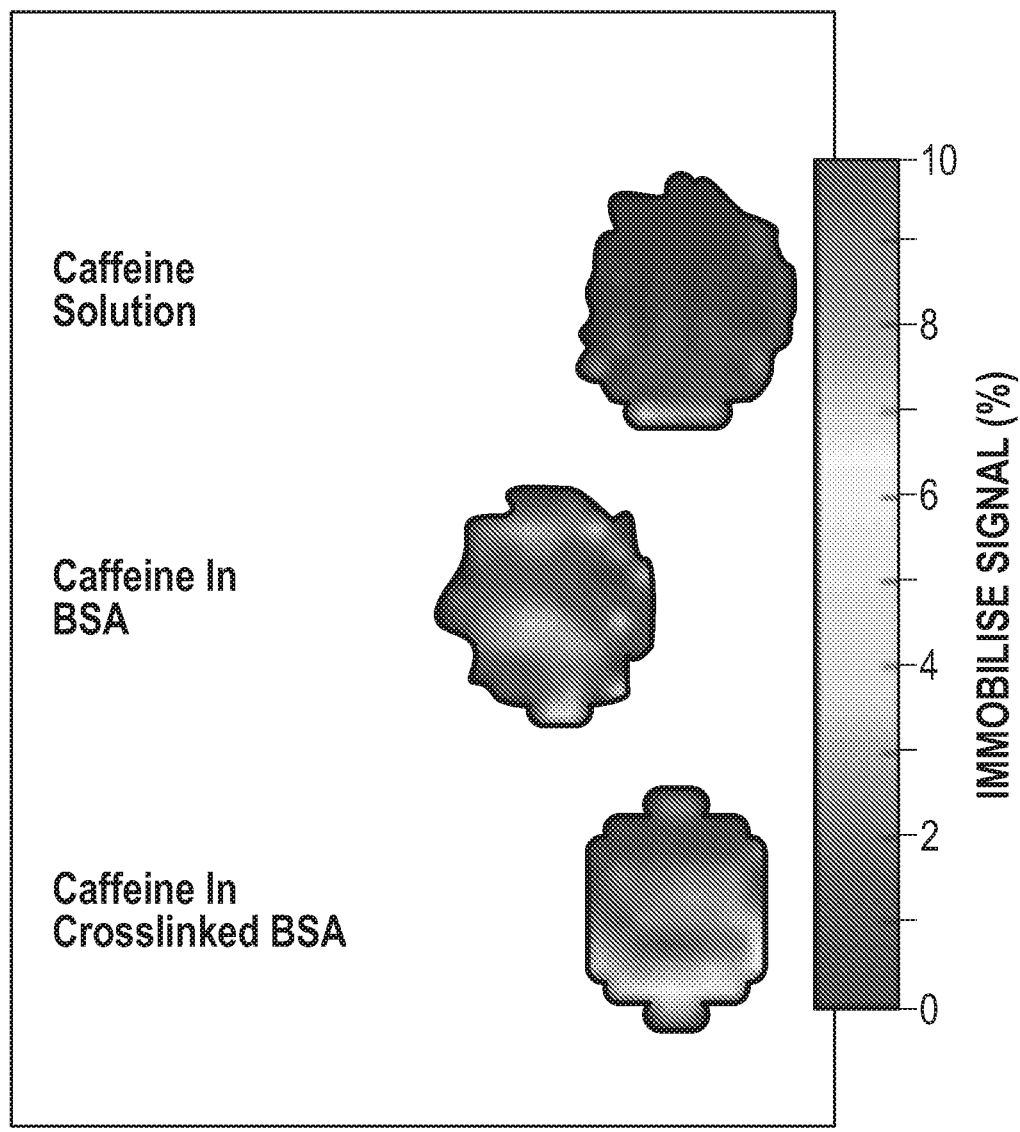
FIG. 5 shows IMMOBILISE-MRI difference maps of 100 mM caffeine in PBS, BSA, and crosslinked BSA. Maps were generated by integrating IMMOBILISE signal from $-1$ to $-2$ ppm.
Figure 6:
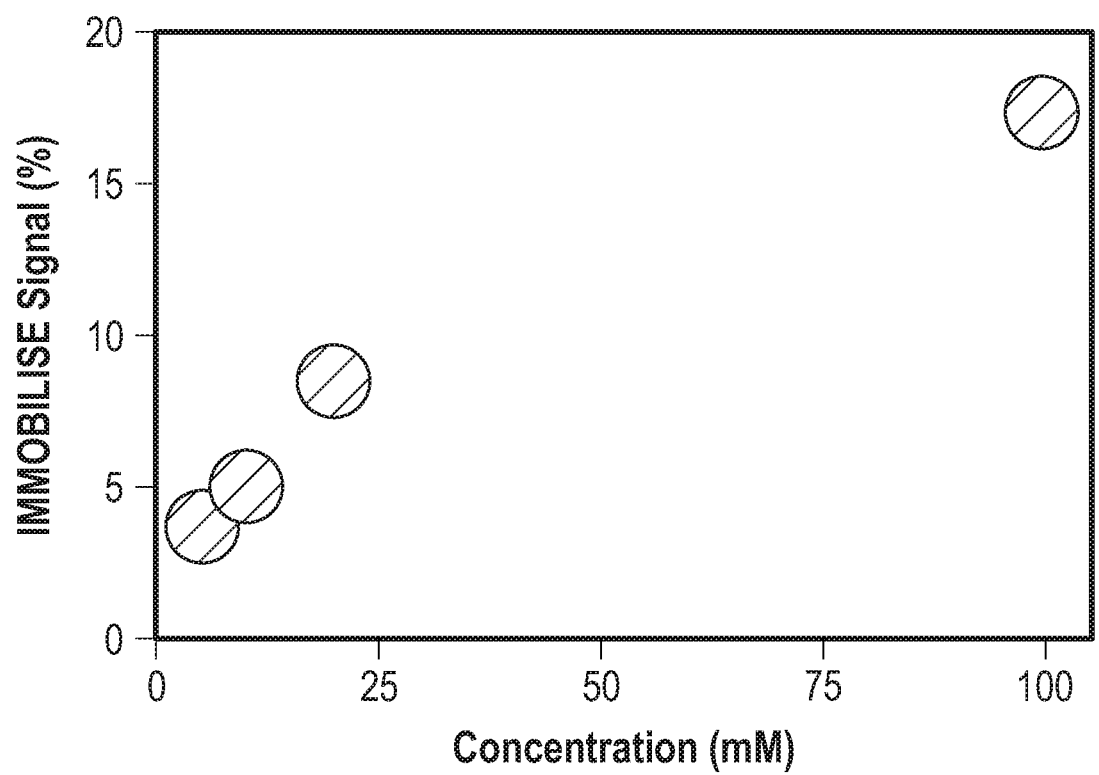
FIG. 6 shows the concentration dependence of the IMMOBILISE effect, showing that 5 mM caffeine can be detected with about 4% signal on water, corresponding to a factor of close to 1000 in sensitivity enhancement.

In FIGS. 4-6 the IMMOBILISE method is applied to caffeine in protein solution, showing that MRI contrast is generated only when there is dynamic binding of RF-labeled caffeine to a rigid target, needed to accomplish efficient transfer of label to bulk water pool. The NMR spectrum of 100 mM caffeine (FIG. 4, (A)) displays peaks of aliphatic protons, including three methyl groups. FIG. 4, (B) show Z-spectra (displaying the relative reduction of water intensity as a function of irradiation frequency relative to the water resonance at 0 ppm) for a solution of bovine serum albumin (BSA) without and with caffeine. The difference spectrum shows negligible signal at the caffeine frequencies. Strikingly, when the protein is crosslinked using glutaraldehyde, signals corresponding to the caffeine resonances become visible in the water saturation difference spectrum (FIG. 4, (C)), with a linewidth corresponding to mobility in free solution. Note that the caffeine signal at −1.6 ppm is approximately 10% of the water signal (110 M protons), equivalent to a detection sensitivity of 11 M caffeine, about 100× the concentration.

This increased sensitivity is sufficient to generate MR images (FIG. 5). These maps, showing IMMOBILISE images from caffeine solution, caffeine with BSA, and caffeine with crosslinked BSA, confirm that only caffeine in crosslinked BSA shows high IMMOBILISE MRI contrast. Thus, contrast from caffeine occurs only when the molecule is transiently immobilised, allowing the RF label of caffeine protons to be transferred to water not directly, but via the semisolid matrix. The signal cannot be from caffeine bound to the semisolid, as the NMR linewidth would be so broad as to make the signals invisible. The signal sensitivity is enhanced because the transfer is continuously refreshed through a label pumping mechanism that exploits the reversible binding. This opens up the exciting possibility to study the binding kinetics of substrates to solid-like structures (e.g. membranes or receptors on there). In FIG. 6, the concentration dependence of the effect is displayed, showing that 5 mM caffeine can be detected with about 4% signal on water, corresponding to a factor of close to 1000 in sensitivity enhancement.

Figure 7:
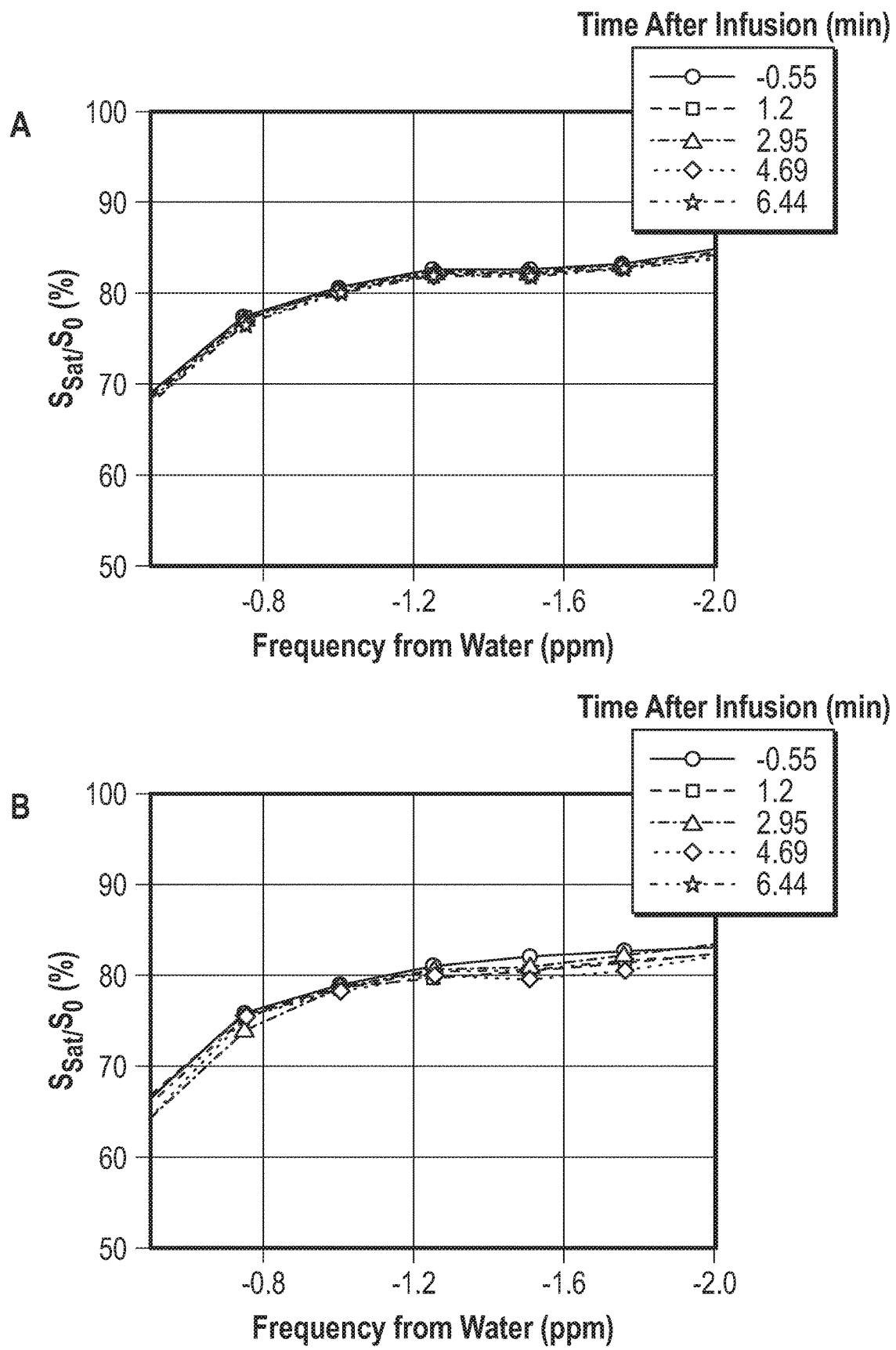
FIG. 7 shows in vivo imaging from mice injected with caffeine. (A, B) Z-spectra of thalamus before and after 20 s infusion of (A) PBS (50 µL) and (B) caffeine (50 µL, 100 mM). Time 0 is after infusion stops.
Figure 8:
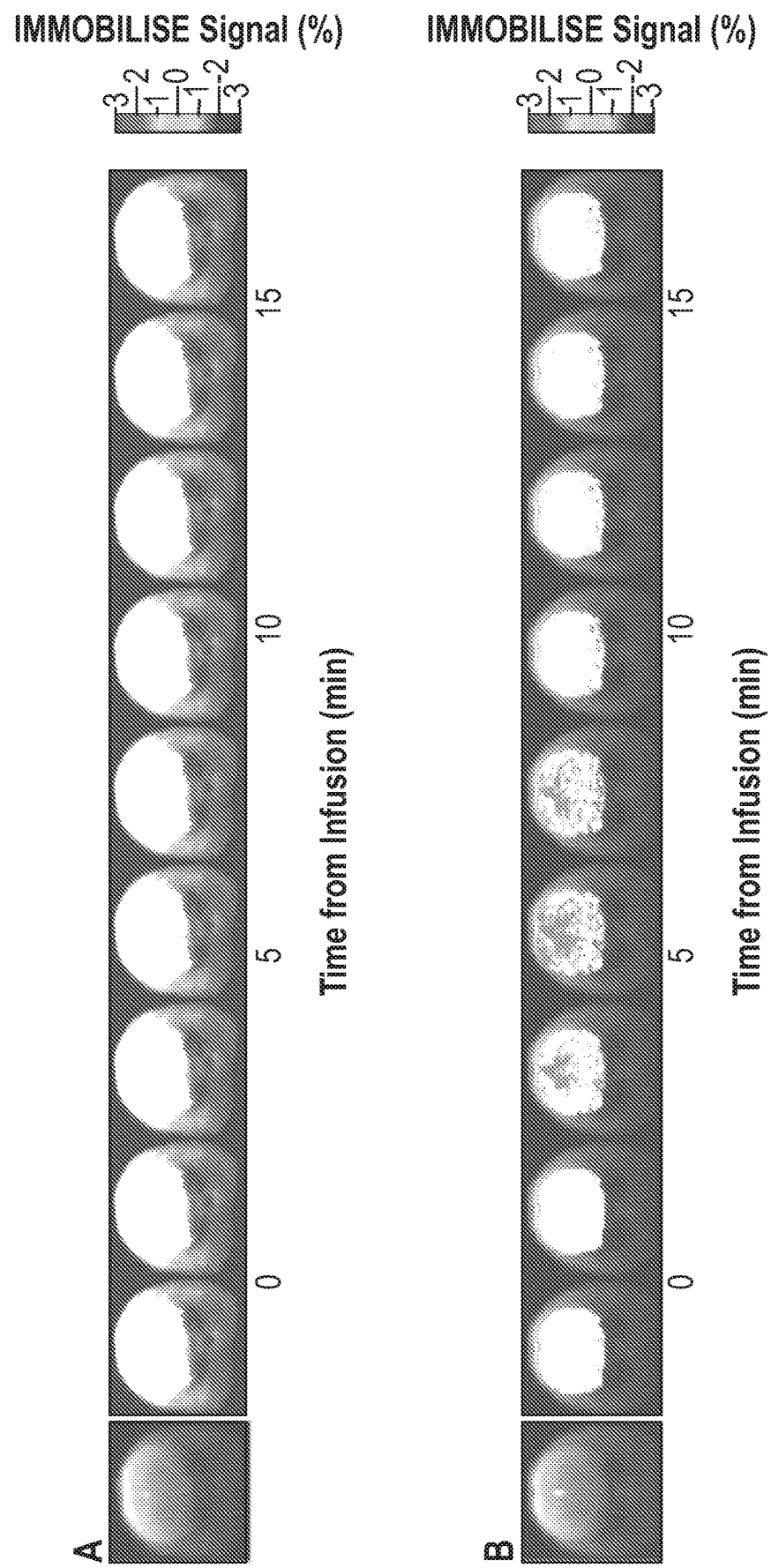
FIG. 8 shows dynamic IMMOBILISE images (at the $-1.5$ ppm frequency) after (A) PBS and (B) caffeine infusion.
Figure 9:
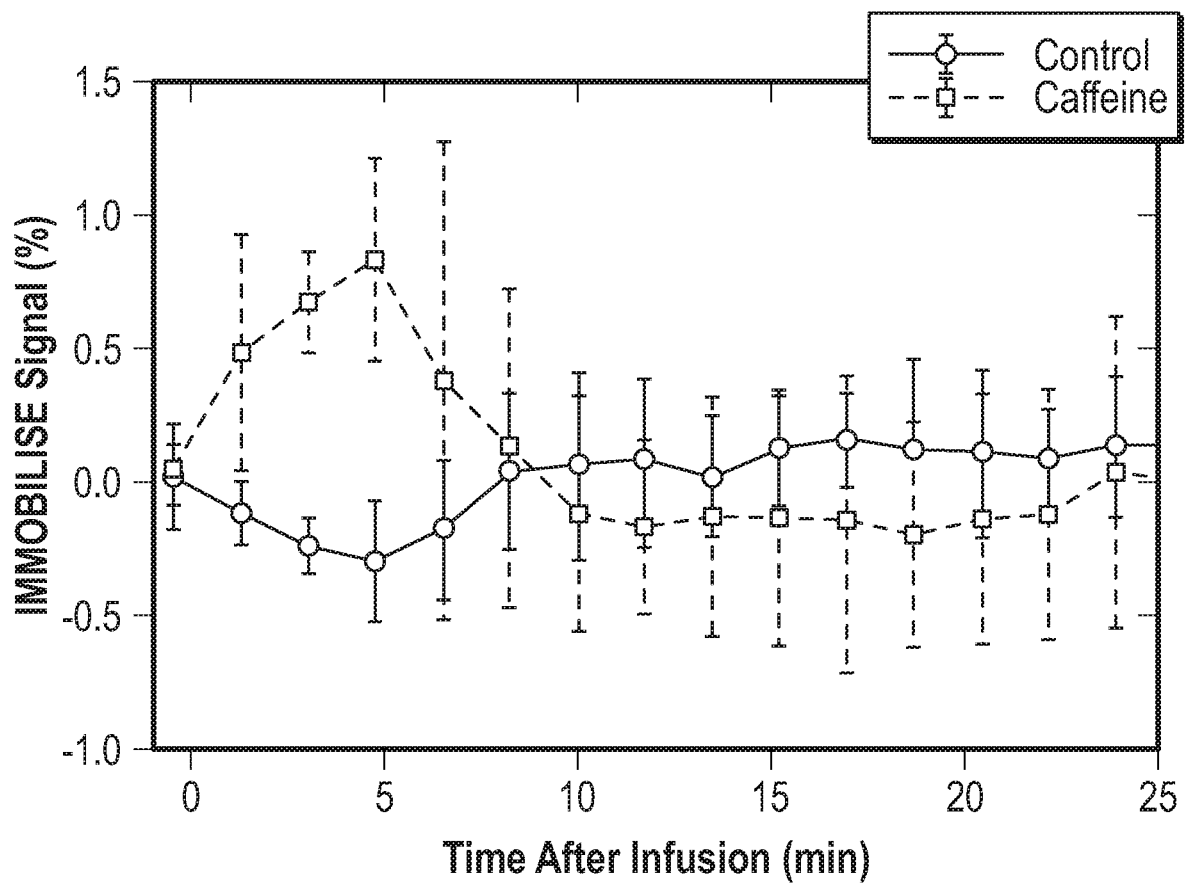
FIG. 9 shows mean and standard deviation of dynamic signal differences in mouse thalamus for PBS (n=3) and caffeine (n=5).

We tested the IMMOBILISE approach in vivo in mice using a PBS-solution of caffeine and PBS controls. Little variation was found for mice injected with just PBS (FIG. 7, (A) and FIG. 8, (A)). In contrast, for mice injected with caffeine, noticeable changes were visible in the thalamus over the caffeine spectral region (FIG. 7, (B), and FIG. 8, (B)). Looking at the average signal change for all mice, the dynamic signal change persisted for about 10 minutes after infusion (FIG. 8, (B) and FIG. 9). This time course excludes the possibility of the effect being due to perfusion, which typically shows contrast over much shorter time frames (<1 min[19]). We estimate that the concentration of caffeine in mouse blood was about 2.5 mM (2 mL blood, 50 μL of 100 mM caffeine infused), with a detection sensitivity of about 1-3% change in water signal, corresponding to 1-3 M water protons, so a factor of 30-100 enhancement, similar to the solution results. For a sufficient supply of labeled ligand, the amount of enhancement is proportional to the amount of binding-transfer events that take place during the irradiation period. As label is transferred rapidly during binding, the sensitivity of this technique, i.e. the efficiency of the pump, is largely determined by the dissociation rate of the molecule.

Figure 2:
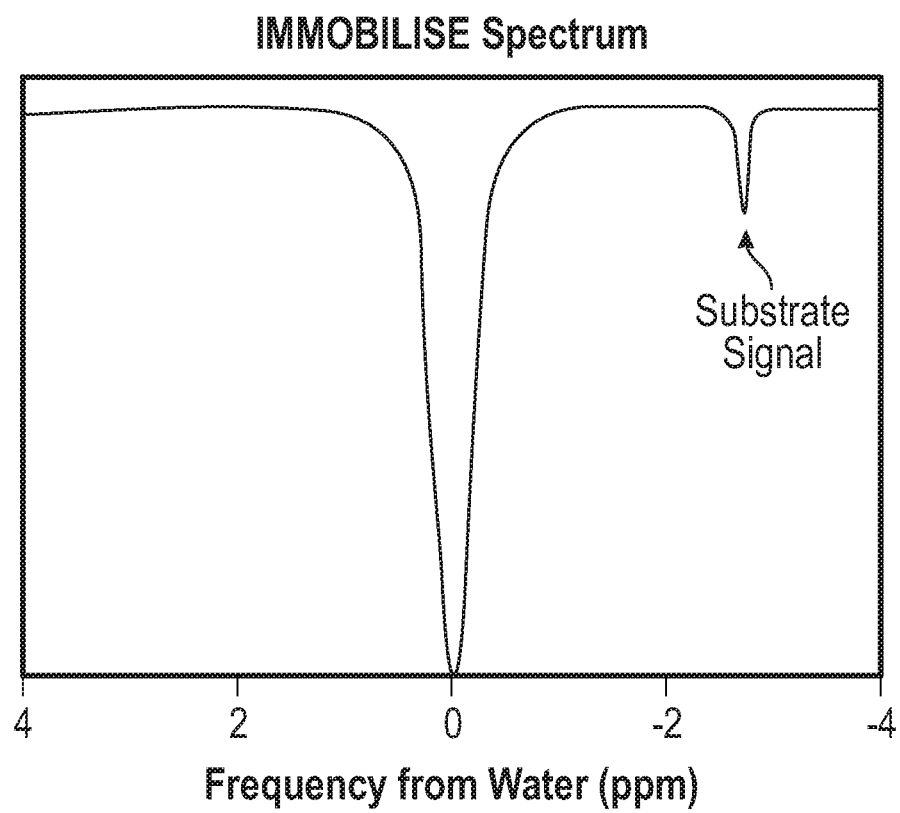
FIG. 2 shows how the change in water magnetization is detected at the resonance frequency of the substrate using the IMMOBILISE method.
Figure 3:
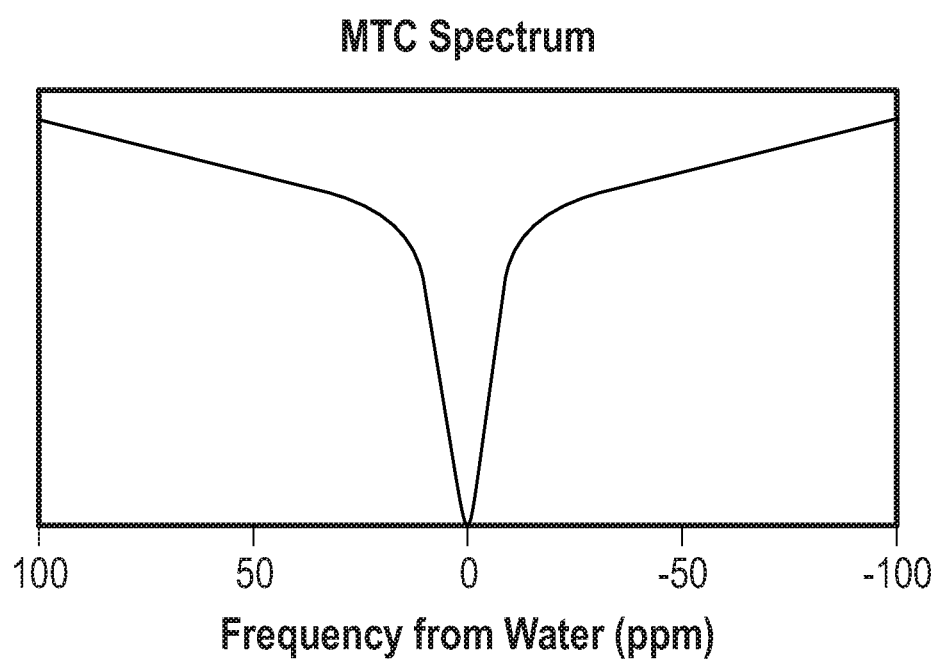
FIG. 3 shows how the high specificity of the IMMOBILISE method is not available in conventional magnetization transfer contrast (MTC) experiments that tend to use indiscriminate labeling and strong RF fields.

The IMMOBILISE approach exploits some principles inherent in chemical exchange saturation transfer imaging, namely pool replenishment through exchange[20,21], but is inherently different as the contrast enhancement occurs in two steps, one of which does not involve exchangeable protons but molecular binding. The IMMOBILISE method can isolate the signal from substrates with high specificity, since the resonance frequency is observed at the substrate-specific proton frequency in the Z-spectrum (FIG. 2). This seems to be contradicted by the result of an increased signal throughout the brain in the caffeine distribution maps. However, this finding is in line with expectation, because caffeine passes freely through most biological membranes, including the blood-brain barrier[22]. There are however brain regions with slightly higher signal. These regions include the thalamus and cortex, which have elevated levels of the adenosine receptor $A_1$ that caffeine is known to bind to[23,24].

Many if not most of the processes involved in biological activity involve formation of two-component complexes. We therefore expect the IMMOBILISE method to have important applications in the fields of drug development and testing, enzyme binding, theranostics, and the study of receptor substrate binding. Only few methods exist for imaging drugs that are relatively weakly bound. This is an important category of drugs since drugs with faster dissociation rates can increase the therapeutic index. Faster binding drugs may target short-lived receptors more effectively[25]. Due to its dynamic character, the IMMOBILISE technique is complementary to nuclear imaging studies where imaging often takes place at a certain time period (up to several hours) after radiotracer injection before imaging.

METHODS

In vitro experiments to demonstrate specificity of substrate binding to a rigid lattice were performed on phantoms prepared using a combination of a caffeine solution (100 mM), 20% (w/w) bovine serum albumin (BSA), and 25% glutaraldehyde separately and for cross-linking the BSA[15]. Each solution was prepared at pH 7.4. MRI scans on these phantoms were done on a 17.6 T Bruker Avance III (Bruker Biospin, Ettlingen, Germany) at 37° C. using a 3 s, 0.5 μT CW saturation pulse followed by a single shot fast spin echo (FSE) MRI readout. The echo time (TE) and repetition time (TR) were set to 4 ms and 6 s respectively. The irradiation frequency was stepped over the proton spectral range (±6 ppm in steps of 0.15 ppm) and a so-called Z-spectrum[26] of the induced relative water saturation as a function of irradiation offset was detected. When using imaging, each voxel will provide such a Z-spectrum.

All experiments were performed in accordance with Institutional Animal Care and Use Committee guidelines and approved by the Johns Hopkins University Animal Care and Use Committee. Eight 6-8 week old female BALB/c mice, were anesthetized by isoflurane and kept warm with a heating pad and kept in place with a stereotactic holder. The tail vein was cannulated for administration of a caffeine solution (100 mM in PBS with pH 7.4). A home-built catheter was connected to a syringe infusion through PE-50 tubing. Two groups of mice were infused with either 50 μL of caffeine solution (n=5) or PBS (n=3) over a 20 s duration with a dose of 0.2 mmol/kg.

MRI experiments were acquired on a 11.7 T Bruker Biospec preclinical scanner (Bruker, Ettlingen, Germany) equipped with a 72 mm quadrature volume resonator for RF transmission and a 2×2 mouse phased array coil for RF reception. The saturation preparation consisted of a 3 s, 0.5 μT CW saturation pulse followed by a two-shot FSE readout. The FSE readout parameters were TR/TE=6000/4 ms, a 64×64 acquisition matrix across a field of view of 17×17 mm and slice thickness of 1 mm. Prior to a bolus infusion of either phosphate buffered saline (PBS) or caffeine, a complete Z-spectrum was acquired with saturation frequencies between ±4 ppm and a partial spectrum with frequencies at −0.50, −0.75, −1.00, −1.25, −1.50, −2.00. Acquisition of each partial Z-spectra took 105 s and was continued for 1-hour post bolus and then a complete Z-spectrum was again acquired.

In order to study the possibility to specifically detect binding, we studied the difference between MRI images and Z-spectra of phantoms with and without caffeine in vitro and before and after infusion of a caffeine solution in vivo. In vivo data was analyzed by subtracting the signal after caffeine infusion from the reference scans acquired prior to infusion. Maps were generated by mapping the signal difference (pre minus post infusion) between the partial spectra (−1.0 to −2.0 ppm). Field correction for static field ($B_0$) inhomogeneities was done by creating field maps from the low power Z-spectra acquired in our study and shifting the Z-spectra voxel wise according to the WASSR method[27].

REFERENCES

1 Jenkins, B. G. Pharmacologic magnetic resonance imaging (phMRI): Imaging drug action in the brain. *Neuroimage* 62, 1072-1085 (2012).

2 Rudin, M. & Weissleder, R. Molecular imaging in drug discovery and development. *Nat. Rev. Drug Discov.* 2, 123-131 (2003).

3 James, M. L. & Gambhir, S. S. A Molecular Imaging Primer: Modalities, Imaging Agents, and Applications. *Physiol. Rev.* 92, 897-965 (2012).

4 Lepre, C. A., Moore, J. M. & Peng, J. W. Theory and Applications of NMR-Based Screening in Pharmaceutical Research. *Chem. Rev.* 104, 3641-3676 (2004).

5 Meyer, B. & Peters, T. NMR spectroscopy techniques for screening and identifying ligand binding to protein receptors. *Angew. Chem. Int. Ed.* 42, 864-890 (2003).

6 Hajduk, P. J. et al. Discovery of Potent Nonpeptide Inhibitors of Stromelysin Using SAR by NMR. *J. Am. Chem. Soc.* 119, 5818-5827 (1997).

7 Mayer, M. & Meyer, B. Group epitope mapping by saturation transfer difference NMR to identify segments of a ligand in direct contact with a protein receptor. *J. Am. Chem. Soc.* 123, 6108-6117 (2001).

8 Forsén, S. & Hoffman, R. A. Study of Moderately Rapid Chemical Exchange Reactions by Means of Nuclear Magnetic Double Resonance. *J. Chem. Phys.* 39, 2892-2901 (1963).

9 Coles, M., Heller, M. & Kessler, H. NMR-based screening technologies. *Drug Discov. Today* 8, 803-810 (2003).
10 Prichard, J. W., Alger, J. R., Behar, K. L., Petroff, O. & Shulman, R. G. Cerebral metabolic studies in vivo by 31P NMR. *Proc. Natl. Acad. Sci. U.S.A.* 80, 2748-2751 (1983).
11 Balaban, R. S., Kantor, H. L. & Ferretti, J. A. In vivo flux between phosphocreatine and adenosine triphosphate determined by two-dimensional phosphorous NMR. *J. Biol. Chem.* 258, 12787-12789 (1983).
12 Bottomley, P. A. Measuring Biochemical Reaction Rates In Vivo with Magnetization Transfer. *eMagRes* 5, 439-458 (2016).
13 Wolff, S. D. & Balaban, R. S. Magnetization transfer contrast (MTC) and tissue water proton relaxation in vivo. *Magn. Reson. Med.* 10, 135-144 (1989).
14 Hinton, D. P. & Bryant, R. G. 1H magnetic cross-relaxation between multiple solvent components and rotationally immobilized protein. Magn. Reson. Med. 35, 497-505 (1996).
15 Swanson, S. D. Protein mediated magnetic coupling between lactate and water protons. *J. Magn. Reson.* 135, 248-255 (1998).
16 Meyerhoff, D. J. Proton magnetization transfer of metabolites in human brain. *Magn. Reson. Med.* 42, 417-420 (1999).
17 Kruiskamp, M. J., de Graaf, R. A., van Vliet, G. & Nicolay, K. Magnetic coupling of creatine/phosphocreatine protons in rat skeletal muscle, as studied by 1H-magnetization transfer MRS. *Magn. Reson. Med.* 42, 665-672 (1999).
18 Leibfritz, D. & Dreher, W. Magnetization transfer MRS. *NMR Biomed.* 14, 65-76 (2001).
19 Cha, S. et al. Dynamic, contrast-enhanced perfusion MRI in mouse gliomas: Correlation with histopathology. *Magn. Reson. Med.* 49, 848-855 (2003).
20 van Zijl, P. C. M. & Yadav, N. N. Chemical exchange saturation transfer (CEST): what is in a name and what isn't? *Magn. Reson. Med.* 65, 927-948 (2011).
21 Ward, K. M., Aletras, A. H. & Balaban, R. S. A new class of contrast agents for MRI based on proton chemical exchange dependent saturation transfer (CEST). *J. Magn. Reson.* 143, 79-87 (2000).
22 McCall, A. L., Millington, W. R. & Wurtman, R. J. Blood-brain barrier transport of caffeine: Dose-related restriction of adenine transport. *Life Sci.* 31, 2709-2715 (1982).
23 Goodman, R. R. & Snyder, S. H. Autoradiographic Localization of Adenosine Receptors in Rat-Brain Using [H-3]Cyclohexyladenosine. *J. Neurosci.* 2, 1230-1241 (1982).
24 Fredholm, B. B., Battig, K., Holmen, J., Nehlig, A. & Zvartau, E. E. Actions of caffeine in the brain with special reference to factors that contribute to its widespread use. *Pharmacol. Rev.* 51, 83-133 (1999).
25 Pan, A. C., Borhani, D. W., Dror, R. O. & Shaw, D. E. Molecular determinants of drug-receptor binding kinetics. *Drug Discov. Today* 18, 667-673 (2013).
26 Bryant, R. G. The dynamics of water-protein interactions. *Annu. Rev. Biophys. Biomol. Struct.* 25, 29-53 (1996).
27 Kim, M., Gillen, J., Landman, B. A., Zhou, J. & van Zijl, P. C. Water saturation shift referencing (WASSR) for chemical exchange saturation transfer (CEST) experiments. *Magn. Reson. Med.* 61, 1441-1450 (2009).

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method to detect transient binding of a substrate molecule of interest in solution to a molecular target, comprising:
    selecting said substrate molecule of interest and said molecular target such that said substrate molecule of interest can transiently bind to said molecular target;
    placing one of a sample or a subject of interest in a magnetic resonance (MR) apparatus, said sample or said subject of interest containing said substrate molecule of interest so as to be in contact with said molecular target;
    providing magnetic labeling of non-exchangeable or slowly exchangeable MR sensitive nuclei of said substrate molecule of interest,
    wherein said selecting said substrate molecule of interest and said molecular target comprises selecting said substrate molecule of interest and said molecular target such that transient binding transfers magnetic labeling from said MR sensitive nuclei of said substrate molecule to MR sensitive nuclei of said molecular target,
    wherein said magnetic labeling becomes distributed over MR sensitive nuclei of said molecular target, and
    wherein said MR sensitive nuclei of said molecular target transfer said magnetic labeling to MR sensitive nuclei of solvent molecules of said solution;
    receiving an MR signal from the MR sensitive nuclei of said solvent molecules using said MR apparatus; and
    analyzing said MR signal to obtain a quantity associated with said transient binding of said substrate molecule of interest to said molecular target.

2. The method of claim 1, further comprising administering said substrate molecule of interest so as to be in contact with said molecular target.

3. The method of claim 2 in which said magnetic labeling of non-exchangeable or slowly exchangeable MR sensitive nuclei of said administered substrate molecule of interest is done before administration using a chemical magnetic labeling procedure.

4. The method of claim 3 in which said chemical magnetic labeling procedure is done using isotopic substitution with nuclei with a magnetic moment including hyperpolarization of such nuclei.

5. The method of claim 2, wherein said administrating is intravenous, oral or any medically approved administration.

6. The method of claim 2, in which the MR signal is recorded as a function of time before, during and after administration of said substrate molecule of interest to the sample or subject in the MR apparatus.

7. The method of claim 1 in which said magnetic labeling of non-exchangeable or slowly exchangeable MR sensitive nuclei of said substrate molecule of interest is done using a radio frequency (RF) pulse sequence from said MR apparatus.

8. The method of claim 7, in which providing magnetic labeling using RF pulses comprises applying sufficient RF strength at a frequency of said nuclei and varying a number of RF pulses or an RF pulse duration, amplitude, or interpulse delay to adjust a magnitude and phase of the magnetization of said nuclei.

9. The method of claim 7, in which a number of RF pulses of said RF pulse sequence is at least one.

10. The method of claim 1, wherein said magnetic labeling is provided substantially continuously over a selected period of time before signal reception so as to maintain label on a substrate molecular pool containing said substrate molecule of interest.

11. The method of claim 1, wherein providing magnetic labeling of slowly exchangeable MR sensitive nuclei of said substrate molecule of interest comprises providing magnetic labeling of MR sensitive nuclei that exchange at a rate slower than an inverse of a longitudinal relaxation time of said MR sensitive nuclei.

12. The method of claim 1, wherein said substrate molecule of interest and said molecular target are selected such that transient binding is done repetitively with substrate containing magnetically labelled nuclei replacing substrate from which label was transferred to the molecular target in order to enhance the amount of magnetic labeling transferred from said substrate molecular pool to said molecular target and distributed over said molecular target and transferred from said molecular target to said solvent.

13. The method of claim 1, wherein the method comprises at least one of magnetic resonance imaging (MRI), magnetic resonance spectroscopy (MRS), magnetic resonance spectroscopic imaging (MRSI), or high resolution nuclear magnetic resonance (NMR) spectroscopy.

14. The method of claim 1, wherein said detecting transient binding has an increased MR detection sensitivity of at least a factor of two larger than an MR signal expected based on a concentration of the molecular substrate in solution.

15. The method of claim 1, wherein transient binding comprises a life time of the bound complex of the substrate molecule of interest and the molecular target of less than 1 second.

16. The method of claim 1, wherein the substrate molecule of interest comprises an organic, inorganic or bio-organic chemical compound containing non-exchangeable or slowly-exchangeable MR sensitive nuclei.

17. The method of claim 16, wherein said substrate molecule is one of a drug, a metabolite, an amino acid, a small protein, a peptide, a nucleic acid, a small DNA, an RNA, or a sugar molecule.

18. The method of claim 16, wherein said substrate molecule is either endogenous to tissue of said sample or said subject of interest or added exogenously thereto or to any configuration holding a molecular target of low mobility.

19. The method of claim 18, wherein a configuration holding a molecular target of low mobility comprises a living subject (human or animal), a separation column, a binding essay with cells, or a chemical or biochemical mixture.

20. The method of claim 1, wherein said molecular target is a molecular target of low mobility so as to comprise molecules that are either partially or fully immobilized or move sufficiently slowly in solution to allow sufficiently fast transfer of magnetization between said molecular target's MR sensitive nuclei to allow said transfer within a time corresponding to less than 5 times T1 of said molecular target's protons.

21. The method of claim 1, in which the molecular target is a protein, DNA, carbohydrate, glycoprotein, receptor, cell membrane, column material, or any solid or semi-solid chemical or biochemical material.

22. The method of claim 1, in which said MR sensitive nuclei are any isotopes that have a nuclear magnetic moment.

23. The method of claim 1, in which transient binding comprises a time sufficiently long to transfer the magnetic label from the substrate to the target but sufficiently short to, during a period of at most five times the longitudinal relaxation time T1 of the molecular protons, allow multiple binding events to occur and allow label to be transferred via the MR sensitive nuclei of the target to the MR sensitive nuclei of the solvent.

24. The method of claim 1, in which the transfer of the magnetic labeling to the MR sensitive nuclei of the molecular target during the transient binding comprises through-space dipolar transfer.

25. The method of claim 1, in which distribution of the magnetic labeling over the MR sensitive nuclei of the molecular target is accomplished using through-space dipolar transfer.

26. The method of claim 1, in which transfer of the magnetic labeling from MR sensitive nuclei of the molecular target to the MR sensitive nuclei of the solvent occurs through processes of dipolar transfer or chemical exchange.

27. The method of claim 1, in which the solvent is tissue water used in MRI.

28. The method of claim 1, in which the solvent is any chemical used for dissolving molecular substrates used in chemical binding processes.

29. The method of claim 1, in which an MR signal relates to a signal recorded using any MR method currently known or possible.

30. The method of claim 1, in which analyzing said recorded MR signal relates to on-line or off-line processing of such data related to the amount of transferred signal consequential to said binding.

31. The method of claim 1, in which said quantity associated with said binding of said molecule is one of
  a signal intensity or signal intensity change showing the presence of binding, or
  a binding rate/dissociation constant associated with said substrate molecule.

32. The method of claim 31, in which said signal intensity or signal intensity change or binding rate/dissociation constant is used for determining a distribution of endogenous receptor molecules.

33. The method of claim 31, in which said signal intensity or signal intensity change or binding rate/dissociation constant is analyzed in at least one tissue area.

34. The method of claim 31, further comprising ascertaining whether said signal intensity, signal intensity change, or binding rate/dissociation constant is abnormal.

35. The method of claim 1, wherein tissues having the molecular target include healthy tissue, cancerous tissues whether malignant or benign, tissue that has experienced trauma, tissue that has experienced ischemia or infarct, tissue that has experienced insult, tissue that is abnormal, or bodily fluids.

36. The method of claim 1, further comprising the steps of:
  acquiring MR image data of a spatial region of interest;
  assessing a magnitude of or a change in molecular content, molecular target, affinity between a binding pair, or pH of tissue in the region of interest using a RF label and magnetization transfer technique; and adjusting contrast of the acquired MR image data based on said assessing so the adjusted acquired MR image data reflects relative differences of said one of molecular content, receptor density, or binding affinity between spatial areas, tissues, and the like within the spatial region of interest.

37. The method of claim 36, further comprising:

generating images based on the adjusted acquired MR image data.

* * * * *